United States Patent
Shiga et al.

(10) Patent No.: US 8,450,189 B2
(45) Date of Patent: May 28, 2013

(54) FILM FOR FLIP CHIP TYPE SEMICONDUCTOR BACK SURFACE

(75) Inventors: Goji Shiga, Osaka (JP); Naohide Takamoto, Osaka (JP); Fumiteru Asai, Osaka (JP)

(73) Assignee: Nitto Denko Corporation, Osaka (JP)

(*) Notice: Subject to any disclaimer, the term of this patent is extended or adjusted under 35 U.S.C. 154(b) by 123 days.

(21) Appl. No.: 13/192,068

(22) Filed: Jul. 27, 2011

(65) Prior Publication Data

US 2012/0025404 A1 Feb. 2, 2012

(30) Foreign Application Priority Data

Jul. 28, 2010 (JP) .................................. 2010-169551

(51) Int. Cl.
*H01L 21/00* (2006.01)

(52) U.S. Cl.
USPC ............................................ 438/464; 438/465

(58) Field of Classification Search
USPC .................................................. 438/460–465
See application file for complete search history.

(56) References Cited

U.S. PATENT DOCUMENTS

| 2004/0104326 A1 | 6/2004 | Demel et al. |
| 2009/0053518 A1 | 2/2009 | Saiki et al. |
| 2010/0301497 A1* | 12/2010 | Misumi et al. ................ 257/778 |

FOREIGN PATENT DOCUMENTS

| JP | 2004-063551 A | 2/2004 |
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2007-158026 A | 6/2007 |
| JP | 2007-250970 A | 9/2007 |
| JP | 2007-261035 A | 10/2007 |
| JP | 2008-006386 A | 1/2008 |
| JP | 2008-166451 A | 7/2008 |

* cited by examiner

*Primary Examiner* — Jenny L Wagner
(74) *Attorney, Agent, or Firm* — Sughrue Mion, PLLC (57) ABSTRACT

The present invention relates to a film for flip chip type semiconductor back surface to be formed on the back surface of a semiconductor element flip chip-connected to an adherend, the film for flip chip type semiconductor back surface having a tensile storage elastic modulus at 25° C. after thermal curing within a range of from 10 GPa to 30 GPa, in which the tensile storage elastic modulus at 25° C. after thermal curing of the film for flip chip type semiconductor back surface falls within a range of from 4 times to 20 times the tensile storage elastic modulus at 25° C. before thermal curing thereof.

8 Claims, 2 Drawing Sheets

FILM FOR FLIP CHIP TYPE SEMICONDUCTOR BACK SURFACE

FIELD OF THE INVENTION

The present invention relates to a film for flip chip type semiconductor back surface, and to a dicing tape-integrated film for semiconductor back surface comprising it. The film for flip chip type semiconductor back surface is used for protecting the back surface of chip-like workpieces (e.g., semiconductor chips) and for enhancing the strength thereof. Moreover, the invention relates to a method for producing a semiconductor device using the dicing tape-integrated film for semiconductor back surface, and to a flip chip-mounted semiconductor device.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

However, protecting the back surface of a semiconductor chip with a protective film requires an additional step of attaching a protective film to the back surface of the semiconductor chip obtained in a dicing step. As a result, the number of the processing steps increases and the production cost is thereby increased. The recent tendency toward thinning of semiconductor devices often brings about a problem in that semiconductor chips are damaged in the step of picking up them. Accordingly, until the picking up step, semiconductor wafers and semiconductor chips are required to be reinforced for the purpose of enhancing the mechanical strength thereof. In particular, when thinned, semiconductor chips are often warped, and it is desired to prevent such thinned semiconductor chips from being warped.

SUMMARY OF THE INVENTION

The present invention has been made in consideration of the foregoing problems and an object thereof is to provide a film for flip chip type semiconductor back surface which can prevent the semiconductor element flip chip-connected onto an adherent from being warped, and to provide a dicing tape-integrated film for semiconductor back surface comprising the same.

Another object of the invention is to provide a method for producing a semiconductor device, in which a semiconductor element can be flip chip-connected onto an adherend with preventing the element from being warped and, as a result, the production yield is increased, and to provide a semiconductor device.

The present inventors have assiduously studied for the purpose of solving the foregoing problems and, as a result, have found that the semiconductor element flip chip-connected onto an adherend can be prevented from being warped by controlling the tensile storage elastic modulus before and after thermal curing of the film for flip chip type semiconductor back surface, and have completed the present invention.

Namely, the present invention provides a film for flip chip type semiconductor back surface to be formed on the back surface of a semiconductor element flip chip-connected to an adherend, the film for flip chip type semiconductor back surface having a tensile storage elastic modulus at 25° C. after thermal curing within a range of from 10 GPa to 30 GPa, in which the tensile storage elastic modulus at 25° C. after thermal curing of the film for flip chip type semiconductor back surface falls within a range of from 4 times to 20 times the tensile storage elastic modulus at 25° C. before thermal curing thereof.

In flip chip mounting, a mold resin to encapsulate the whole of a semiconductor package (PKG; flip chip type semiconductor device) is not used, but, in general, an encapsulating resin called an underfill resin is used for encapsulating only the bump-connecting part between the adherend and the semiconductor element. Therefore, the back surface of the semiconductor element is exposed. Accordingly, for example, in thermally curing the encapsulating resin, stress is imparted to the semiconductor element owing to curing shrinkage, and the semiconductor element may be thereby warped owing to the stress given thereto. In particular, the warping of thin semiconductor elements having a thickness of at most 300 μm (even having a thickness of at most 200 μm) may be remarkable.

The film for flip chip type semiconductor back surface of the invention is formed on the back surface of a semiconductor element to be flip chip-connected onto an adherend, thereby fulfilling the function of protecting semiconductor element. In addition, of the film for flip chip type semiconductor back surface of the invention, the tensile storage elastic modulus at 25° C. after thermal curing falls within a range of from 10 GPa to 30 GPa, and is at least 4 times the tensile storage elastic modulus at 25° C. before thermal curing thereof, and therefore, the film for flip chip type semiconductor back surface formed on the back surface of a semiconductor element can shrink in such a manner that the film can resist the encapsulating resin to cure and shrink around the element. Accordingly, the whole of the semiconductor package can be prevented from being warped. On the other hand, since the tensile storage elastic modulus of the film after thermal curing is at most 20 times the tensile storage elastic modulus thereof at 25° C. before thermal curing thereof, the semiconductor package can be prevented from being cracked during reflowing. Herein, the back surface of the semiconductor element means the surface (non-circuit surface) opposite to the surface (circuit surface) thereof on which a circuit is formed.

Preferably, the tensile storage elastic modulus at 25° C. before thermal curing is from 0.5 GPa to 7 GPa, preferably from 1 GPa to 5 GPa. When a semiconductor element with the film for flip chip type semiconductor back surface stuck thereto is transported by the use of a support or the like, the film for flip chip type semiconductor back surface formed on the back surface of the semiconductor element can be prevented from adhering to the support since the tensile storage elastic modulus at 25° C. before thermal curing of the film is at least 0.5 GPa. On the other hand, having the tensile storage elastic modulus of at most 7 GPa, the adhesiveness of the film to semiconductor wafers is good.

Preferably, the film for flip chip type semiconductor back surface is formed of a resin composition containing a filler in an amount of from 65% by weight to 95% by weight of the resin composition. When the amount of the filler in the resin composition falls within the above range, the tensile storage elastic modulus at 25° C. after thermal curing can be within a range of from 10 GPa to 30 GPa and can be within a range of from 4 times to 20 times the tensile storage elastic modulus at 25° C. before thermal curing.

The present invention also provides a dicing tape-integrated film for semiconductor back surface, which comprises a dicing tape, and the above-mentioned film for flip chip type semiconductor back surface laminated on the dicing tape, wherein the dicing tape comprises a base material and a pressure-sensitive adhesive layer laminated on the base material, and the film for flip chip type semiconductor back surface is laminated on the pressure-sensitive adhesive layer.

According to the dicing tape-integrated film for semiconductor back surface having the constitution as above, the dicing tape and the film for flip chip type semiconductor back surface are integrated, and therefore the dicing tape-integrated film of the type can be used in a dicing step of dicing a semiconductor wafer to produce a semiconductor element and the subsequent picking up step. Namely, when a dicing tape is attached to the back surface of a semiconductor wafer prior to the dicing step, the film for semiconductor back surface can also be attached thereto at the same time, and therefore, a step of attaching the film for semiconductor back surface alone to the semiconductor wafer (semiconductor back surface film attaching step) is not required. As a result, the number of the processing steps may be reduced. Moreover, since the film for semiconductor back surface protects the back surface of the semiconductor wafer and that of the semiconductor element formed by dicing, damaging (e.g., cracking, chipping) of the semiconductor element can be prevented or reduced during the dicing step and the subsequent step (e.g., picking up step).

Further, in flip chip mounting, a mold resin to encapsulate the whole of a semiconductor package (PKG; flip chip type semiconductor device) is not used, but only the bump-connecting part between the adherend and the semiconductor element is encapsulated with an encapsulating resin called an underfill. Herein, the tensile storage elastic modulus at 25° C. after thermal curing of the film for flip chip type semiconductor back surface according to the invention is within a range of from 10 GPa to 30 GPa, and is at least 4 times the tensile storage elastic modulus at 25° C. before thermal curing thereof, and therefore, the film for flip chip type semiconductor back surface formed on the back surface of a semiconductor element can shrink in such a manner that the film can resist the encapsulating resin to cure and shrink around the element. As a result, the whole of the semiconductor package can be prevented from being warped. In addition, since the tensile storage elastic modulus at 25° C. after thermal curing of the film for flip chip type semiconductor back surface according to the invention is at most 20 times the tensile storage elastic modulus at 25° C. before thermal curing thereof, the semiconductor package can be prevented from being cracked during reflowing.

The present invention further provides a method for producing a semiconductor device wherein the above-mentioned dicing tape-integrated film for semiconductor back surface is used, the method comprising:

attaching a semiconductor wafer onto the film for flip chip type semiconductor back surface in the dicing tape-integrated film for semiconductor back surface, dicing the semiconductor wafer to form a semiconductor element, peeling the semiconductor element along with the film for flip chip type semiconductor back surface, from the pressure-sensitive adhesive layer of the dicing tape, and flip chip-connecting the semiconductor element onto an adherend.

In the above-mentioned method, the dicing tape-integrated film for semiconductor back surface is stuck to the back surface of a semiconductor wafer, and therefore the method does not require a step of attaching the film for semiconductor back surface alone (semiconductor back surface film attaching step). Moreover, in the semiconductor wafer dicing step and the picking up step for the semiconductor element formed by the dicing, since the back surface of the semiconductor wafer or the semiconductor element is protected with the film for semiconductor back surface, the semiconductor wafer or element can be protected from being damaged. As a result, the production yield can be increased in producing flip chip type semiconductor devices.

Preferably, the above-mentioned flip chip-bonding (flip chip connecting step) includes filling an encapsulating resin into a gap between the semiconductor element flip chip-bonded onto the adherend and the adherend, followed by thermally curing the encapsulating resin.

In thermally curing the encapsulating resin, stress is imparted to the semiconductor element by the curing shrinkage thereof, and due to the stress, the semiconductor element may be thereby warped. In particular, the warping of thin semiconductor elements having a thickness of at most 300 µm (even having a thickness of at most 200 µm) may be remarkable. However, in the above-mentioned method, the tensile storage elastic modulus (25° C.) after thermal curing is from 10 GPa to 30 GPa, and is from 4 times to 20 times the tensile storage elastic modulus (25° C.) before thermal curing, and therefore, the film for flip chip type semiconductor back surface formed on the back surface of a semiconductor element can shrink in such a manner that the film can resist the encapsulating resin to shrink in thermal curing of the resin. Accordingly, the whole of the semiconductor package (PKG; flip chip type semiconductor device) can be prevented from being warped. In addition, the semiconductor package can be prevented from being cracked during reflowing.

As the semiconductor wafer, herein usable is one having a thickness of from 20 µm to 300 µm. Accordingly, thin flip chip semiconductor devices can be produced.

The present invention furthermore provides a flip chip type semiconductor device produced in accordance with the above-mentioned semiconductor device production method.

The film for flip chip type semiconductor back surface of the invention is formed on the back surface of a semiconductor element flip chip-connected onto an adherend, and therefore fulfills the function of protecting the semiconductor element. In addition, of the film for flip chip type semiconductor back surface of the invention, the tensile storage elastic modulus at 25° C. after thermal curing falls within a range of from 10 GPa to 30 GPa, and is from 4 times to 20 times the tensile storage elastic modulus at 25° C. before thermal curing thereof, and therefore, the film for flip chip type semiconductor back surface formed on the back surface of a semiconductor element can shrink in such a manner that the film can resist the encapsulating resin to cure and shrink around the element. As a result, the whole of the semiconductor package can be prevented from being warped. In addition, the semiconductor package (PKG; flip chip type semiconductor device) can be effectively prevented from being cracked during reflowing.

In addition, according to the dicing tape-integrated film for semiconductor back surface of the invention, the dicing tape and the film for flip chip type semiconductor back surface are integrated, and therefore the dicing tape-integrated film of the type can be used in a dicing step of dicing a semiconductor wafer to produce a semiconductor element and the subsequent picking up step. As a result, a step of attaching the film for semiconductor back surface alone (semiconductor back surface film attaching step) is not required. Moreover, in the subsequent dicing step and the picking up step, since the film for semiconductor back surface is stuck to the back surface of the semiconductor wafer or the semiconductor element formed by dicing, the semiconductor wafer and the semiconductor element can be effectively protected, and the semiconductor element can be prevented from being damaged. In addition, the whole of the semiconductor device where a semiconductor element is flip chip-connected onto an adherend can be prevented from being warped.

According to the semiconductor device production method of the invention, the dicing tape-integrated film for semiconductor back surface is stuck to the back surface of a semiconductor wafer, and therefore, a step of attaching a film for semiconductor back surface alone is not required. Moreover, in the semiconductor wafer dicing step and the picking up step for the semiconductor element formed by the dicing, since the back surface of the semiconductor wafer or the semiconductor element is protected with the film for semiconductor back surface, the semiconductor wafer or element can be protected from being damaged. In addition, the whole of the semiconductor device where a semiconductor element is flip chip-connected onto an adherend can be prevented from being warped. As a result, the production yield can be increased in producing flip chip type semiconductor devices.

Description of Reference Numerals and Signs

1  Dicing Tape-Integrated Film for Semiconductor Back Surface
2  Film for Semiconductor Back Surface
3  Dicing Tape
31 Base Material
32 Pressure-Sensitive Adhesive Layer
33 Part Corresponding to Semiconductor Wafer-Attaching Part
4  Semiconductor Wafer
5  Semiconductor Chip
51 Bump Formed on the Circuit Face Side of Semiconductor Chip 5
6  Adherend
61 Conductive Material for Conjunction Attached to Connection Pad of Adherend 6

BEST MODE FOR CARRYING OUT THE INVENTION

Figure 1:
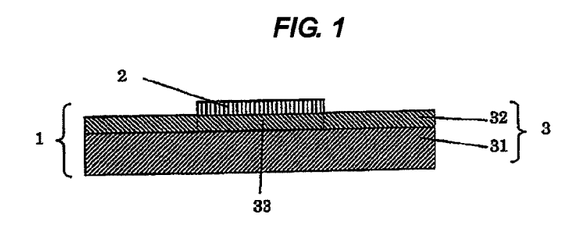
FIG. 1 is a cross-sectional schematic view showing one embodiment of a dicing tape-integrated film for semiconductor back surface of the invention.

Embodiments of the present invention are described with reference to FIG. 1 but the invention is not restricted to these embodiments. FIG. 1 is a cross-sectional schematic view showing one embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.

(Dicing Tape-Integrated Film for Semiconductor Back Surface)

As shown in FIG. 1, the dicing tape-integrated film for semiconductor back surface 1 (hereinafter sometimes also referred to as "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31, and, as formed on the pressure-sensitive adhesive layer 32, the film for flip chip type semiconductor back surface 2 (hereinafter sometimes referred to as "film for semiconductor back surface" or "semiconductor back surface protective film"). Also as shown in FIG. 1, the dicing tape-integrated film for semiconductor back surface of the invention may be so designed that the film for semiconductor back surface 2 is formed only on the part 33 corresponding to the semiconductor wafer-attaching part; however, the film for semiconductor back surface may be formed over the whole surface of the pressure-sensitive adhesive layer 32. Incidentally, the surface of the film for semiconductor back surface 2 (surface to be attached to the back surface of wafer) may be protected with a separator or the like until the film is attached to wafer back surface.

(Film for Flip Chip Type Semiconductor Back Surface)

The film for semiconductor back surface 2 has a film shape. The film for semiconductor back surface 2 is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer (details are described below).

The tensile storage elastic modulus at 25° C. after thermal curing of the film 2 for semiconductor back surface is from 10 GPa to 30 GPa and is from 4 times to 20 times the tensile storage elastic modulus before thermal curing thereof. In flip chip connection, a semiconductor element is flip chip-bonded onto an adherend and then the connecting part alone between the adherend and the semiconductor element is encapsulated with an encapsulating material (e.g., encapsulating resin called underfill). Further, the encapsulating material is thermally cured, whereupon stress is imparted to the semiconductor element through curing shrinkage of the encapsulating material. However, according to the film 2 for semiconductor back surface of this embodiment, the tensile storage elastic modulus at 25° C. after thermal curing of the film is at least 4 times the tensile storage elastic modulus at 25° C. before thermal curing thereof, and therefore, in thermally curing the encapsulating material, the film cures and shrinks in such a manner that it can resist the encapsulating material to cure and shrink around the film. As a result, the semiconductor element can be prevented from being warped. Accordingly, even though the semiconductor element flip chip-connected onto the adherend is thin (for example, having a thickness of at most 300 μm, even at most 200 μm), the whole of the semiconductor package can be prevented from being warped. The degree of warping through curing shrinkage of the film 2 for semiconductor back surface is, when the film is stuck to a semiconductor chip having a thickness of 100 μm and a size, length×width of 10 mm×10 mm, preferably at least 200 μm. However, in case where the degree of warping of the film 2 for semiconductor back surface is too large over the degree of warping of the encapsulating material, then the semiconductor package may be warped owing to this; and from this viewpoint, the degree of warping of the film 2 is preferably at most 300 μm. The method for measuring the degree of warping is described in detail in Examples given below.

The tensile storage elastic modulus at 25° C. after thermal curing of the film 2 for semiconductor back surface of this embodiment is at most 20 times the tensile storage elastic modulus at 25° C. before thermal curing thereof, and therefore, the semiconductor package with the film (PKG; flip chip type semiconductor device) can be prevented from being cracked during reflowing. The lowermost limit of the tensile storage elastic modulus at 25° C. after thermal curing is preferably at least 11 GPa (more preferably at least 12 GPa). The uppermost limit is preferably at most 28 GPa (more preferably at most 25 GPa). The tensile storage elastic modulus at 25° C. after thermal curing is preferably from 4 times to 15 times the tensile storage elastic modulus at 25° C. before curing, more preferably from 4 times to 10 times. Thermal curing of the film 2 for semiconductor back surface means, for example, such a condition that the film is cured through heat treatment at a heating temperature of 200° C. for 2 hours.

The tensile storage elastic modulus at 25° C. after thermal curing of the film 2 for semiconductor back surface is determined by preparing the film in an uncured state without lamination onto the dicing tape 3, then curing it under heat at 165° C. for 2 hours, and measuring the elastic modulus of the cured film in a tensile mode under the condition of a sample width of 10 mm, a sample length of 22.5 mm, a sample thickness of 0.2 mm, a frequency of 1 Hz, and a heating rate of 10° C./minute in a nitrogen atmosphere at a prescribed temperature (25° C.) using a dynamic viscoelasticity measuring apparatus "Solid Analyzer RS A2" manufactured by Rheometrics Co. Ltd., and the measured value is regarded as the tensile storage elastic modulus of the film.

The tensile storage elastic modulus after thermal curing of the film 2 for semiconductor back surface can be controlled, for example, by incorporating a filler into the film. The modulus may also be controlled by changing the type and the content of the resin component (e.g., thermoplastic resin component, thermosetting resin component) in the film 2 for semiconductor back surface. When a filler is incorporated into the film 2 for semiconductor back surface, then the electroconductivity may be given to the film or the thermal conductivity of the film can be enhanced. The film 2 for semiconductor back surface may be electroconductive or non-electroconductive.

The filler may be any of an inorganic filler and an organic filler but an inorganic filler is suitable. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within a range of from 0.1 μm to 80 μm. The average particle diameter of the inorganic filler can be measured, for example, by a laser diffractiometric particle sizer. The blending amount of the filler (in particular, inorganic filler) is preferably from 65% by weight to 90% by weight of the resin composition, more preferably from 68% by weight to 88% by weight, even more preferably from 70% by weight to 85% by weight. When the blending amount of the filler is from 65% by weight to 90% by weight of the resin composition and in case where a semiconductor element with the film for flip chip type semiconductor back surface stuck thereto is transported by the use of a support or the like, then the film for flip chip type semiconductor back surface formed on the back surface of the semiconductor element can be prevented from adhering to the support.

The film 2 for semiconductor back surface may be a single-layered film or a laminated film where a plurality of layers are laminated. In case where the film 2 for semiconductor back surface is a laminated film, the tensile storage elastic modulus at 25° C. after thermal curing of the film may be good to be from 10 GPa to 30 GPa and from 4 times to 20 times the tensile storage elastic modulus before thermal curing thereof, as the tensile storage elastic modulus after thermal curing of the whole laminated film.

The tensile storage elastic modulus at 25° C. before thermal curing (in an uncured or semi-cured state) of the film 2 for semiconductor back surface is preferably from 0.5 GPa to 7 GPa, more preferably from 1 GPa to 5 GPa, furthermore preferably from 1.5 GPa to 4.5 GPa. When the tensile storage elastic modulus is at least 0.5 GPa and in case where a semiconductor chip is, along with the film 2 for semiconductor back surface stuck thereto, peeled from the pressure-sensitive adhesive layer 32 of the dicing tape and then the film 2 for semiconductor back surface is put on a support and is transported, then the film for semiconductor back surface can be effectively prevented from adhering to the support. On the other hand, when the tensile storage elastic modulus is at most 7 GPa, the adhesion of the film to a semiconductor wafer may be good. The support is, for example, the top tape, the bottom tape or the like in a carrier tape. In case where the film 2 for semiconductor back surface is formed of a resin composition containing a thermosetting resin component, as mentioned above, the thermosetting resin component is usually in an uncured or partially cured state, so that the tensile storage elastic modulus of the film for semiconductor back surface at 25° C. is the tensile storage elastic modulus at 25° C. in a state that the thermosetting resin component is uncured or partially cured.

The tensile storage elastic modulus at 25° C. before thermal curing of the film 2 for semiconductor back surface is determined by preparing the film in an uncured state without lamination onto the dicing tape 3, and measuring the elastic modulus of the cured film in a tensile mode under the condition of a sample width of 10 mm, a sample length of 22.5 mm, a sample thickness of 0.2 mm, a frequency of 1 Hz, and a heating rate of 10° C./minute in a nitrogen atmosphere at a prescribed temperature (25° C.) using a dynamic viscoelasticity measuring apparatus "Solid Analyzer RS A2" manufactured by Rheometrics Co. Ltd., and the measured value is regarded as the tensile storage elastic modulus of the film.

In case where the film 2 for semiconductor back surface is a laminated film, the tensile storage elastic modulus before thermal curing thereof may be good to fall within a range of from 0.5 GPa to 7 GPa as that of the whole laminated film. The tensile storage elastic modulus (25° C.) of the film 2 for semiconductor back surface in a state where the film is uncured may be controlled by suitably determining the type and the content of the resin component (e.g., thermoplastic resin component, thermosetting resin component) to be mentioned below, and the type and the content of the filler such as silica filler or the like.

In case where the tensile storage elastic modulus before thermal curing of the film 2 for semiconductor back surface is controlled by incorporating the filler into the film, the amount of the filler is preferably from 65% by weight to 95% by weight, more preferably from 68% by weight to 90% by weight, still more preferably from 70% by weight to 85% by weight. Preferably, the average particle diameter of the inorganic filler is within a range of from 0.1 µm to 80 µm. The average particle diameter of the inorganic filler can be measured, for example, by a laser diffractiometric particle sizer. Examples of the filler usable here are mentioned above.

The film 2 for semiconductor back surface can be formed of a resin composition, and the resin composition is preferably one comprising at least a thermosetting resin component. Formed of at least a thermosetting resin component, the film for semiconductor back surface can effectively exhibit the function as an adhesive layer. However, the resin composition may contain a thermoplastic resin component.

In case where the resin composition contains a thermoplastic resin component, the proportion thereof is preferably less than 30% by weight of all the resin components (for example, from 0% by weight to less than 30% by weight), more preferably at most 28% by weight (even more preferably at most 25% by weight) from the viewpoint of the adhesiveness of the resin film to semiconductor wafers. When the proportion of the thermoplastic resin component in the resin composition is too small, then the film formability of the resin composition may lower. Accordingly, the lowermost limit of the proportion of the thermoplastic resin component in the resin composition to all the resin components therein is preferably at least 5% by weight, more preferably at least 10% by weight, even more preferably at least 15% by weight, from the viewpoint of the film formability of the resin composition.

The proportion of the thermosetting resin component in the resin composition is the remaining part of all the resin components, 100% by weight, from which the proportion of the thermoplastic resin component is subtracted. In case where the proportion of the thermoplastic resin component is 0% by weight of all the resin components, then the resin composition is a resin composition (thermosetting resin composition) containing, as the resin component therein, only a thermosetting resin component (but not containing a thermoplastic resin component).

Moreover, examples of the thermosetting resin component include, in addition to an epoxy resin and a phenol resin, an amino resin, an unsaturated polyester resin, a polyurethane resin, a silicone resin and a thermosetting polyimide resin. The thermosetting resin component may be employed singly or in a combination of two or more kinds. As the thermosetting resin component, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Not specifically defined, the phenoxy resin as the thermoplastic resin component includes, for example, an epoxy resin having a phenolic component incorporated therein as a constitutive unit, such as a resin obtained through reaction of an epichlorohydrin and a diphenolic compound (divalent phenolic compound), and a resin obtained through reaction of a divalent epoxy compound and a diphenolic compound. Examples of the phenoxy resin include those having at least one skeleton selected from a bisphenol skeleton (e.g., bisphenol A-type skeleton, bisphenol F-type skeleton, bisphenol A/F mixed-type skeleton, bisphenol S-type skeleton, bisphenol M-type skeleton, bisphenol P-type skeleton, bisphenol A/P mixed-type skeleton, bisphenol Z-type skeleton), a naphthalene skeleton, a norbornene skeleton, a fluorene skeleton, a biphenyl skeleton, an anthracene skeleton, a novolak skeleton, a pyrene skeleton, a xanthene skeleton, an adamantan skeleton and a dicyclopentadiene skeleton. As the phenoxy resin, herein usable are commercial products. One or more different types of phenoxy resins may be used here either singly or as combined.

Furthermore, the above-mentioned phenol resin acts as a curing agent of the epoxy resin or the phenoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

Regarding the blending ratio thereof, for example, the epoxy resin and the phenolic resin are preferably so blended that the hydroxyl group in the phenolic resin could be from 0.5 equivalents to 2.0 equivalents per one equivalent of the epoxy group in the epoxy resin component. More preferably, the hydroxyl group could be from 0.8 equivalents to 1.2 equivalents. Specifically, in case where the blending ratio of the two oversteps the above range, then the curing reaction could not be sufficiently attained and the properties of the cured epoxy resin product may readily deteriorate.

The thermal curing-accelerating catalyst for epoxy resins and phenolic resins may be suitably selected from known thermal curing-accelerating catalysts without limitation. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

Not specifically defined, the amine-based curing accelerator includes, for example, monoethanolamine trifluoroborate (manufactured by Stella Chemifa Co., Ltd.), dicyandiamide (manufactured by Nacalai Tesque Co., Ltd.).

Not specifically defined, the phosphorus-based curing accelerator includes, for example, triorganophosphines such as triphenyl phosphine, tributyl phosphine, tri(p-methylphenyl)phosphine, tri(nonylphenyl)phosphine, diphenyltolyl phosphine; as well as tetraphenylphosphonium bromide (trade name TPP-PB), methyltriphenylphosphonium (trade name TPP-MB), methyltriphenylphosphonium chloride (trade name TPP-MC), methoxymethyltriphenylphosphonium (trade name TPP-MOC), benzyltriphenylphosphonium chloride (trade name TPP-ZC) (all manufactured by Hokko Chemical Industry Co., Ltd.). Preferably, the triphenyl phosphine compounds are substantially insoluble in epoxy resin. When insoluble in epoxy resin, then they may prevent excessive thermal curing. The thermal curing catalyst having a triphenyl phosphine structure and substantially insoluble in epoxy resin is, for example, methyltriphenyl phosphonium (trade name TPP-MB). Herein, the term "insoluble" means that the thermal curing catalyst comprising a triphenyl phosphine compound is insoluble in a solvent comprising an epoxy resin, more precisely, the catalyst does not dissolve in the solvent in an amount of 10% by weight or more at a temperature falling within a range of from 10 to 40° C.

The imidazole-based curing accelerator includes 2-methylimidazole (trade name 2MZ), 2-undecylimidazole (trade name C11-Z), 2-heptadecylimidazole (trade name C17Z), 1,2-dimethylimidazole (trade name 1,2DMZ), 2-ethyl-4-methylimidazole (trade name 2E4MZ), 2-phenylimidazole (trade name 2PZ), 2-phenyl-4-methylimidazole (trade name 2P4MZ), 1-benzyl-2-methylimidazole (trade name 1B2MZ), 1-benzyl-2-phenylimidazole (trade name 1B2PZ), 1-cyanoethyl-2-methylimidazole (trade name 2MZ-CN), 1-cyanoethyl-2-undecylimidazole (trade name C11Z-CN), 1-cyanoethyl-2-phenylimidazolium trimellitate (trade name 2PZCNS-PW), 2,4-diamino-6-[2'-methylimidazolyl-(1')]-ethyl-s-triazine (trade name 2MZ-A), 2,4-diamino-6-[2'-undecylimidazolyl-(1')]-ethyl-s-triazine (trade name C11Z-A), 2,4-diamino-6-[2'-ethyl-4'-methylimidazolyl-(1')]-ethyl-s-triazine (trade name 2E4MZ-A), 2,4-diamino-6-[2'-methylimidazolyl-(1')]-ethyl-s-triazine isocyanuric acid adduct (trade name 2MA-OK), 2-phenyl-4,5-dihydroxymethylimidazole (trade name 2PHZ-PW), 2-phenyl-4-methyl-5-hydroxymethylimidazole (trade name 2P4 MHZ-PW) (all manufactured by Shikoku Chemical Industry Co., Ltd.).

Not specifically defined, the boron-based curing accelerator includes, for example, trichloroborane.

Not specifically defined, the phosphorus/boron-based curing accelerator includes, for example, tetraphenylphosphonium tetraphenyl borate (trade name TPP-K), tetraphenylphosphonium tetra-p-triborate (trade name TPP-MK), benzyltriphenylphosphonium tetraphenyl borate (trade name TPP-ZK), triphenylphosphine triphenylborane (trade name TPP-S) (all by Hokko Chemical Industry Co., Ltd.).

The blending ratio of the thermal curing-accelerating catalyst is preferably within a range of from 0.01 to 15 parts by weight, more preferably from 0.02 to 10 parts by weight, even more preferably from 0.05 to 5 parts by weight, relative to 100 parts by weight of the thermosetting resin. When the blending ratio is at least 0.01 parts by weight relative to 100 parts by weight of the thermosetting resin, then the tensile storage elastic modulus at 25° C. after thermal curing of the composition can be at least 10 GPa. In addition, while the encapsulating resin is thermally cured, the film 2 for semiconductor back surface can also be fully thermally cured so that the film can be surely adhered to and fixed on the back surface of a semiconductor element thereby producing a flip chip type semiconductor device with no risk of film peeling. On the other hand, when the blending ratio is at most 15 parts by weight relative to 100 parts by weight of the thermosetting resin, then the tensile storage elastic modulus at 25° C. after thermal curing of the composition can be at most 30 GPa, and curing retardation can be prevented.

Examples of the thermoplastic resin component include natural rubber, butyl rubber, isoprene rubber, chloroprene rubber, ethylene-vinyl acetate copolymer, ethylene-acrylic acid copolymer, ethylene-acrylate copolymer, polybutadiene resin, polycarbonate resin, thermoplastic polyimide resin, polyamide resin such as 6-nylon and 6,6-nylon, phenoxy resin, acrylic resin, saturated polyester resin such as PET (polyethylene terephthalate) or PBT (polybutylene terephthalate), polyamidimide resin, and fluororesin. The thermoplastic resin may be employed singly or in a combination of two or more kinds. Among these thermoplastic resin components, acrylic resin containing few ionic impurities, having high heat resistance and capable of securing reliability of semiconductor elements is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

As the acrylic resin, also preferred is an acrylic resin (acrylic rubber) having a glass transition temperature (Tg) of not lower than 25° C. In case where such an acrylic resin having Tg of not lower than 25° C. is used, the tensile storage elastic modulus (after thermal curing, 25° C.) of the film for semiconductor back surface can be still controlled to be at least 10 GPa even though the film contains the acrylic resin. Tg may be good to be not lower than 25° C., but is preferably not lower than 26° C., more preferably not lower than 27° C., even more preferably not lower than 28° C. The uppermost limit of Tg is preferably not higher than 200° C., and is more preferably not higher than 150° C., not higher than 120° C., not higher than 100° C., not higher than 80° C. and not higher than 50° C., or is as lower as possible in that order. When Tg is higher than 200° C., then there may occur a disadvantage in that the package may be cracked during reflowing. Tg of the acrylic resin can be controlled by the type and the proportion of the constitutive monomers, and by the type of the curing catalyst. Tg of the acrylic resin can be measured through thermomechanical analysis (TMA).

It is important that the film 2 for semiconductor back surface has adhesiveness (close adhesiveness) to the back surface (non-circuit-formed face) of semiconductor wafer. The film 2 for semiconductor back surface can be, for example, formed of a resin composition containing an epoxy resin as the thermosetting resin component. In case where the film 2 for semiconductor back surface is crosslinked beforehand to some degree, at its preparation, a polyfunctional compound capable of reacting with the functional group or the like at the molecular chain end of polymer can be added as a crosslinking agent. Thereby, the adhesive property of the film at high temperatures may be improved and the heat resistance thereof may be enhanced.

The adhesive force of the film for semiconductor back surface to semiconductor wafer (23° C., peeling angle of 180°, peeling rate of 300 mm/min) is preferably within a range of from 0.5 N/20 mm to 15 N/20 mm, more preferably from 0.7 N/20 mm to 10 N/20 mm. Having the adhesive force of at least 0.5 N/20 mm, the film can be adhered to semiconductor wafer and semiconductor element with excellent adhesiveness and is free from film swelling or the like adhesion failure. In addition, in dicing of semiconductor wafer, the chips can be prevented from flying out. On the other hand, having the adhesive force of at most 15 N/20 mm, the film can be readily peeled from dicing tape.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component. In the invention, instead of the use of the crosslinking agent or together with the use of the crosslinking agent, it is also possible to perform a crosslinking treatment by irradiation with an electron beam, UV light, or the like.

The film 2 for semiconductor back surface is preferably colored. Thereby, an excellent appearance property can be exhibited, and it becomes possible to make a semiconductor device having a value-added appearance property. Specifically, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of $a^*$ and $b^*$ are within the range of preferably −10 to 10, more preferably −5 to 5, and further preferably −3 to 3 (particularly 0 or about 0).

In the present embodiment, $L^*$, $a^*$, and $b^*$ defined in the $L^*a^*b^*$ color space can be determined by a measurement with a color difference meter (a trade name "CR-200" manufactured by Minolta Ltd; color difference meter). The $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in Japanese Industrial Standards in JIS Z8729.

At coloring of the film 2 for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface in the dicing tape-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 is colored, the colored form is not particularly restricted. The film for semiconductor back surface may be, for example, a single-layer film-shaped article added with a coloring agent. Moreover, the film may be a laminated film where a resin layer formed of at least a thermosetting resin component and a coloring agent layer are at least laminated. In this regard, in the case where the film for semiconductor back surface 2 is a laminated film of the resin layer and the coloring agent layer, the film for semiconductor back surface 2 in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2, other additives can be suitably blended according to the necessity. Examples of the other additives include an extender, an anti-aging agent, an antioxidant, and a surfactant, in addition to a flame retardant, a silane-coupling agent, and an ion-trapping agent.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxy silane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 can be, for example, formed by utilizing a commonly used method including mixing a thermosetting resin component such as an epoxy resin and, if necessary, a thermoplastic resin component such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 is formed of a resin composition containing a thermosetting resin component such as an epoxy resin, the film 2 for semiconductor back surface is in a state that the thermosetting resin component is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin component in the film for semiconductor back surface is completely or almost completely cured.

As above, since the film 2 for semiconductor back surface is in a state that the thermosetting resin component is uncured or partially cured even when the film contains the thermosetting resin, the gel fraction of the film 2 for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film 2 for semiconductor back surface can be measured by the following measuring method.

<Gel Fraction Measuring Method>

About 0.1 g of a sample is sampled from the film 2 for semiconductor back surface and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and Drying})/(\text{Weight of sample})] \times 100 \quad (a)$$

The gel fraction of the film 2 for semiconductor back surface can be controlled by the kind and content of the resin components and the kind and content of the crosslinking agent and besides, heating temperature, heating time and the like.

In the invention, in the case where the film 2 for semiconductor back surface is a film-shaped article formed of a resin composition containing a thermosetting resin component such as an epoxy resin, close adhesiveness to a semiconductor wafer can be effectively exhibited.

Incidentally, since cutting water is used in the dicing step of the semiconductor wafer, the film 2 for semiconductor back surface absorbs moisture to have a moisture content of a normal state or more in some cases. When flip chip bonding is performed with still maintaining such a high moisture content, water vapor remains at the adhesion interface between the film 2 for semiconductor back surface and the semiconductor wafer or its processed body (semiconductor) and lifting is generated in some cases. Therefore, by constituting the film 2 for semiconductor back surface as a configuration in which a core material having a high moisture permeability is provided on each surface thereof, water vapor diffuses and thus it becomes possible to avoid such a problem. From such a viewpoint, a multilayered structure in which the film 2 for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film 2 for semiconductor back surface is not particularly restricted but can be, for example, suitably selected from the range of about 2 μm to 200 μm. Furthermore, the thickness is preferably about 4 μm to 160 μm, more preferably about 6 μM to 100 μm, and particularly about 10 μm to 80 μm.

In the case where the film for semiconductor back surface 2 is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

Preferably, the film for semiconductor back surface 2 is protected with a separator (release liner) (not shown in figures). The separator has a function as a protective material for protecting the film for semiconductor back surface until it is practically used. Further, in the dicing tape-integrated film 1 for semiconductor back surface, the separator may further serve as the supporting base material in transferring the film 2 for semiconductor back surface onto the pressure-sensitive adhesive layer 32 of the base material of the dicing tape. The separator is peeled off when a semiconductor wafer is attached onto the film for semiconductor back surface in the dicing tape-integrated film 1 for semiconductor back surface. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

In case where the film 2 for semiconductor back surface is not laminated with the dicing tape 3, the film 2 for semiconductor back surface may be wound up along with one separator having a release layer on both sides thereof, into a roll in which the film 2 is protected with the separator having a release layer on both surfaces thereof; or the film 2 may be protected with a separator having a release layer on at least one surface thereof.

(Dicing Tape)

The dicing tape 3 includes a base material 31 and a pressure-sensitive adhesive layer 32 formed on the base material 31. Thus, it is sufficient that the dicing tape 3 has a configuration in which the base material 31 and the pressure-sensitive adhesive layer 32 are laminated. The base material (supporting base material) 31 can be used as a supporting material for the pressure-sensitive adhesive layer 32 and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated.

A commonly used surface treatment, e.g., an oxidizing treatment in accordance with chemical or physical method such as a chromate treatment, ozone exposure, flame exposure, exposure to high-voltage electric shock, or an ionized radiation treatment, or a coating treatment with an undercoating agent may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of a pressure-sensitive adhesive and has a pressure-sensitive adhesiveness. Not specifically defined, the pressure-sensitive adhesive may be suitably selected from known pressure-sensitive adhesives. Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives) and thermally expandable pressure-sensitive adhesives. One or more such pressure-sensitive adhesives may be used here either singly or as combined.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one of more alkyl (meth)acrylates as monomer component(s).

The alkyl (meth)acrylate for the acrylic pressure-sensitive adhesive includes, for example, methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, etc. As the alkyl (meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl (meth)acrylate (copolymerizable monomer component), for the purpose of improving the cohesive force, the heat resistance and the crosslinkability thereof. The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid; acid anhydride group-containing monomers such as maleic anhydride, itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, (4-hydroxymethylcyclohexyl) methyl methacrylate; sulfonic acid group-containing monomers such as styrenesulfonic acid, allylsulfonic acid, 2-(meth)acrylamide-2-methylpropanesulfonic acid, (meth) acrylamide-propanesulfonic acid, sulfopropyl (meth)acrylate, (meth)acryloyloxynaphthalenesulfonic acid; phosphoric acid group-containing monomers such as 2-hydroxyethyl acryloylphosphate; (N-substituted) amide monomers such as (meth)acrylamide, N,N-dimethyl(meth)acrylamide, N-butyl (meth)acrylamide, N-methylol(meth)acrylamide, N-methylolpropane(meth)acrylamide; aminoalkyl (meth)acrylate monomers such as aminoethyl (meth)acrylate, N,N-dimethylaminoethyl (meth)acrylate, t-butylaminoethyl (meth)acrylate; alkoxyalkyl (meth)acrylate monomers such as methoxyethyl (meth)acrylate, ethoxyethyl (meth)acrylate; cyanoacrylate monomers such as acrylonitrile, methacrylonitrile; epoxy group-containing acrylic monomers such as glycidyl (meth)acrylate; styrene monomers such as styrene, α-methylstyrene; vinyl ester monomers such as vinyl acetate, vinyl propionate; olefin monomers such as isoprene, butadiene, isobutylene; vinyl ether monomers such as vinyl ether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam; maleimide monomers such as N-cyclohexylmaleimide, N-isopropylmaleimide, N-laurylmaleimide, N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide; succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide; acryl glycolate monomers such as polyethylene glycol (meth)acrylate, polypropylene glycol (meth)acrylate, methoxyethylene glycol (meth)acrylate, methoxypolypropylene glycol (meth)acrylate; acrylate monomers having a hetero ring, a halogen atom, a silicone atom or the like such as tetrahydrofurfuryl (meth)acrylate, fluoro(meth)acrylate, silicone (meth)acrylate; polyfunctional monomers such as hexanediol di(meth)acrylate, (poly)ethylene glycol di(meth)acrylate, (poly)propylene glycol di(meth) acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth) acrylate, epoxyacrylate, polyester acrylate, urethane acrylate, divinylbenzene, butyl di(meth)acrylate, hexyl di(meth)acrylate, etc. One or more these copolymerizable monomer components may be used here either singly or as combined.

The radiation-curable pressure-sensitive adhesive (or energy ray-curable pressure-sensitive adhesive) (composition) usable in the invention includes, for example, an internal-type radiation-curable pressure-sensitive adhesive comprising, as the base polymer, a polymer having a radical-reactive carbon-carbon double bond in the polymer side chain, main chain or main chain terminal, and a radiation-curable pressure-sensitive adhesive prepared by incorporating a UV-curable monomer component or oligomer component in a pressure-sensitive adhesive. The thermally expandable pressure-sensitive adhesive also usable here includes, for example, those comprising a pressure-sensitive adhesive and a foaming agent (especially thermally expandable microspheres).

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent can be used, for example, for controlling the pressure-sensitive adhesive force before UV irradiation, or for controlling the pressure-sensitive adhesive force after UV irradiation. By using the crosslinking agent, external crosslinking can be attained. The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted but is appropriately determined depending on the balance with the base polymer (particularly acrylic polymer) to be crosslinked and further depending on the use application of the pressure-sensitive adhesive. In general, the crosslinking agent is preferably blended in an amount of about 20 parts by weight or less, more preferably from 0.1 part by weight to 10 parts by weight based on 100 parts by weight of the base polymer.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

Not specifically defined, the thickness of the pressure-sensitive adhesive layer 32 may be, for example, from 5 μm to 300 μm (preferably from 5 μm to 200 μm, more preferably from 5 μm to 100 μm, even more preferably from 7 μm to 50 μm) or so. When the thickness of the pressure-sensitive adhesive layer 32 falls within the range, then the layer can exhibit a suitable pressure-sensitive adhesive force. The pressure-sensitive adhesive layer 32 may be a single layer or a multilayer.

The adhesive force of the pressure-sensitive adhesive layer 32 of the dicing tape 3 to the film for flip chip type semiconductor back surface 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining Incidentally, in the invention, the film 2 for semiconductor back surface or the dicing tape-integrated film 1 for semiconductor back surface can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the film 2 for semiconductor back surface or the dicing tape-integrated film 1 for semiconductor back surface may be formed in a form where it is wound as a roll or may be formed in a form where the sheet (film) is laminated. For example, in the case where the film has the form where it is wound as a roll, the film is wound as a roll in a state that the film 2 for semiconductor back surface or the laminate of the film 2 for semiconductor back surface and the dicing tape 3 is protected by a separator according to needs, whereby the film can be prepared as a film 2 for semiconductor back surface or a dicing tape-integrated film 1 for semiconductor back surface in a state or form where it is wound as a roll. In this regard, the dicing tape-integrated film 1 for semiconductor back surface in the state or form where it is wound as a roll may be constituted by the base material 31, the pressure-sensitive adhesive layer 32 formed on one surface of the base material 31, the film for semiconductor back surface 2 formed on the pressure-sensitive adhesive layer 32, and a releasably treated layer (rear surface treated layer) formed on the other surface of the base material 31.

Incidentally, the thickness of the dicing tape-integrated film 1 for semiconductor back surface (total thickness of the thickness of the film for semiconductor back surface and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

As mentioned above, in the dicing tape-integrated film 1 for semiconductor back surface, by controlling the ratio of the thickness of the film 2 for semiconductor back surface to the thickness of the pressure-sensitive adhesive layer 32 of the dicing tape 3 or the ratio of the thickness of the film 2 for semiconductor back surface to the thickness of the dicing tape (total thickness of the base material 31 and the pressure-sensitive adhesive layer 32), a dicing property at the dicing step, a picking-up property at the picking-up step, and the like can be improved and the dicing tape-integrated film 1 for semiconductor back surface can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film 1 for semiconductor back surface as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive composition is applied to the base material 31 and dried thereon (and optionally crosslinked under heat) to form the pressure-sensitive adhesive layer 32. The coating system includes roll coating, screen coating, gravure coating, etc. The pressure-sensitive adhesive composition may be directly applied to the base material 31 to form the pressure-sensitive adhesive layer 32 on the base material 31; or the pressure-sensitive adhesive composition may be applied to a release sheet or the like of which the surface has been processed for lubrication, to form the pressure-sensitive adhesive layer 32 thereon, and the pressure-sensitive adhesive layer 32 may be transferred onto the base material 31 to form the pressure-sensitive adhesive layer 32 on the base material 31. Accordingly, the dicing tape 3 is prepared by forming the pressure-sensitive adhesive layer 32 on the base material 31.

On the other hand, a coating layer is formed by applying a forming material for forming the film 2 for semiconductor back surface onto a release paper so as to have a prescribed thickness after drying and further drying under prescribed conditions (in case where thermal curing is required or the like, performing a heating treatment to achieve drying, if necessary). By transferring the coating layer onto the pressure-sensitive adhesive layer 32, the film 2 for semiconductor back surface is formed on the pressure-sensitive adhesive layer 32. In this regard, the film 2 for semiconductor back surface can be also formed on the pressure-sensitive adhesive layer 32 by directly applying the forming material for forming the film 2 for semiconductor back surface onto the pressure-sensitive adhesive layer 32, followed by drying under prescribed conditions (in case where thermal curing is required or the like, performing a heating treatment to achieve drying, if necessary). Consequently, the dicing tape-integrated film 1 for semiconductor back surface according to the invention can be obtained. Incidentally, in case where thermal curing is performed at the formation of the film 2 for semiconductor back surface, it is important to perform the thermal curing to such an extent that the film is in a partially cured state. However, it is preferable that the thermal curing is not performed.

In case where the film 2 for semiconductor back surface is not integrated with the dicing tape 3 and is alone, the film may be produced in the same manner as that for the film 2 for semiconductor back surface mentioned above. Concretely, a forming material for the film 2 for semiconductor back surface is applied onto a release paper so as to have a prescribed thickness after drying, and then dried under prescribed conditions (optionally under heat, if desired for thermal curing) to form a coating layer thereon, thereby producing the film 2 for semiconductor back surface.

The film 2 for semiconductor back surface and the dicing tape-integrated film for semiconductor back surface 1 of the invention can be suitably used at the production of a semiconductor device including the flip chip connection step. Namely, the film 2 for semiconductor back surface and the dicing tape-integrated film for semiconductor back surface 1 of the invention are used at the production of a flip chip-mounted semiconductor device and thus the flip chip-mounted semiconductor device is produced in a condition or form where the film 2 for semiconductor back surface or the film 2 for semiconductor back surface of the dicing tape-integrated film 1 for semiconductor back surface is attached to the back surface of the semiconductor chip. Therefore, the film 2 for semiconductor back surface and the dicing tape-integrated film 1 for semiconductor back surface of the invention can be used for a flip chip-mounted semiconductor device (a semiconductor device in a state or form where the semiconductor chip is fixed to an adherend such as a substrate by a flip chip bonding method).

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Method for Semiconductor Device)

The production method for semiconductor device of this embodiment is described below with reference to FIGS. 2A to 2D. FIGS. 2A to 2D show cross-sectional schematic views of a production method for a semiconductor device where the dicing tape-integrated film 1 for semiconductor back surface mentioned above is used. In case where the film 2 for semiconductor back surface is not integrated with a dicing tape and is alone, a semiconductor device can also be produced using the film of the type, according to the production method for semiconductor device of using the dicing tape-integrated film 1 for semiconductor back surface shown in FIGS. 2A to 2D. In this case, a dicing tape 3 is stuck to one side of the film 2 for semiconductor back surface, and then the film 2 for semiconductor back surface may be stuck to a semiconductor wafer; or after the film 2 for semiconductor back surface is stuck to a semiconductor wafer, a dicing tape may be stuck to the film 2 for semiconductor back surface.

According to the semiconductor device production method, a semiconductor device can be produced using the dicing tape-integrated film 1 for semiconductor back surface. Concretely, the method comprises at least a step of attaching a semiconductor wafer 4 onto the dicing tape-integrated film 1 for semiconductor back surface, a step of dicing the semiconductor wafer 4, a step of picking up the semiconductor element 5 obtained by dicing, and a step of flip chip-connecting the semiconductor element 5 onto an adherend 6.

(Mounting Step)

Figure 2A:
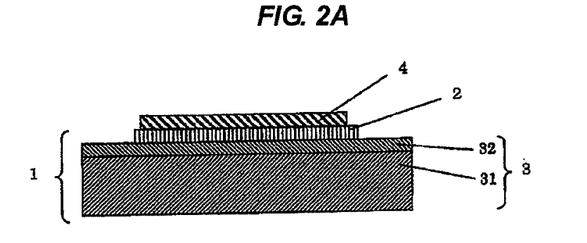
FIGS. 2A to 2D are cross-sectional schematic views showing one embodiment of a process for producing a semiconductor device using a dicing tape-integrated film for semiconductor back surface of the invention.

First, as shown in FIG. 2A, a separator optionally provided on the film for semiconductor back surface 2 of the dicing tape-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the dicing tape-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 2B:
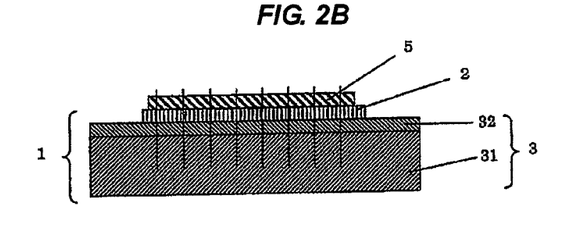

Next, as shown in FIG. 2B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is adhered and fixed by the dicing tape-integrated film for semiconductor back surface 1 having the film for semiconductor back surface, chip crack and chip fly can be suppressed, as well as the damage of the semiconductor wafer 4 can also be suppressed. In this regard, when the film for semiconductor back surface 2 is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface 1 downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Picking-Up Step)

Figure 2C:
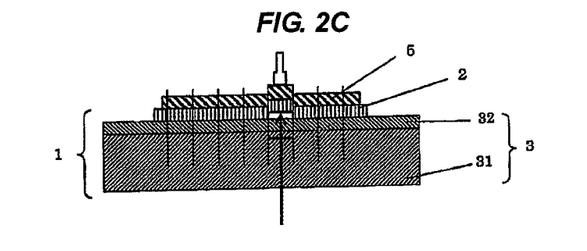

In order to collect the semiconductor chip 5 that is adhered and fixed to the dicing tape-integrated film for semiconductor back surface 1, picking-up of the semiconductor chip 5 is performed as shown in FIG. 2C to peel the semiconductor chip 5 together with the film for semiconductor back surface 2 from the dicing tape 3. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. In this regard, the back surface of the picked-up semiconductor chip 5 is protected with the film for semiconductor back surface 2.

(Flip Chip Connecting Step)

Figure 2D:
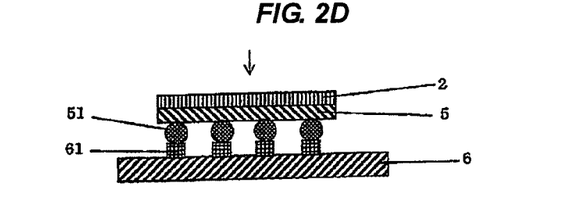

The picked-up semiconductor chip 5 is fixed on an adherend such as a substrate according to a flip chip bonding method (flip chip mounting method), as shown in FIG. 2D. Concretely, the semiconductor chip 5 is fixed on the adherend 6 according to an ordinary method in such a manner that the circuit face of the semiconductor chip 5 (this may be referred to as a front surface, a circuit pattern formed surface or an electrode formed surface) could face the adherend 6. For example, while the bump 51 formed on the circuit surface side of the semiconductor chip 5 is pressed against the bonding conductive material (e.g., solder) 61 attached to the connecting pad of the adherend 6, the conductive material is melted to secure the electric connection between the semiconductor chip 5 and the adherend 6 and the semiconductor chip 5 is thereby fixed to the adherend 6 (flip chip-bonding step). In this case, gaps are formed between the semiconductor chip 5 and the adherend 6, and the gap distance may be generally from 30 μm to 300 μm or so. After the semiconductor chip 5 has been flip chip-bonded (flip chip-connected) onto the adherend 6, it is important that the interface and the gaps between the semiconductor chip 5 and the adherend 6 are cleaned up and the two are sealed up by filling the gaps with an encapsulating material (e.g., encapsulating resin).

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step (flip chip connecting step), the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the thermal curing of the encapsulating resin is usually carried out at 175° C. for 60 seconds to 90 seconds. However, in the invention, without limitation thereto, the curing may be performed at a temperature of from 165° C. to 185° C. for several minutes, for example. By the thermal treatment in this step, the encapsulating resin is cured and shrunk as the thermal curing proceeds. However, even when stress is imparted to the semiconductor chip 5 owing to the curing shrinkage of the encapsulating resin, the film for semiconductor back surface can resist the stress since the tensile storage elastic modulus of the film is at least 10 GPa, and therefore, in the state where the semiconductor element is not warped or is warped little, a flip chip-bonded semiconductor chip can be obtained. Moreover, by the step, the film 2 for semiconductor back surface can be completely or almost completely cured and can be attached to the back surface of the semiconductor element with excellent close adhesiveness. Further, the film 2 for semiconductor back surface according to the invention can be thermally cured together with the encapsulating material at the encapsulation step even when the film is in an uncured state, so that it is not necessary to newly add a step for thermal curing of the film 2 for semiconductor back surface.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film for semiconductor back surface 1 or the film for semiconductor back surface 2, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface 1 or the film for semiconductor back surface 2 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

<Preparation of Film for Flip Chip Type Semiconductor Back Surface>

40 parts of a phenoxy resin (trade name "EP4250" manufactured by JER Co., Ltd.), 129 parts of a phenolic resin (trade name "MEH-8000" manufactured by Meiwa Chemical Co., Ltd.), 663 parts of a spherical silica (trade name "SO-25R" manufactured by Admatechs Co., Ltd.), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution A").

The resin composition solution A was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film A for flip chip type semiconductor back surface having a thickness (average thickness) of 60 μm.

<Preparation of Dicing Tape-Integrated Film for Semiconductor Back Surface>

Using a hand roller, the film A for flip chip type semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 10 μm) to prepare a dicing tape-integrated film A for semiconductor back surface.

Example 2

<Preparation of Film for Flip Chip Type Semiconductor Back Surface>

40 parts of a phenoxy resin (trade name "EP4250" manufactured by JER Co., Ltd.), 129 parts of a phenolic resin (trade name "MEH-8000" manufactured by Meiwa Chemical Co., Ltd.), 1137 parts of a spherical silica (trade name "SO-25R" manufactured by Admatechs Co., Ltd.), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution B").

The resin composition solution B was applied onto a releasably treated film, as a release liner (separator), composed of a polyethylene terephthalate film having a thickness of 50 μM, which had been subjected to a silicone-releasing treatment, and then dried at 130° C. for 2 minutes to prepare a film B for flip chip type semiconductor back surface having a thickness (average thickness) of 60 μm.

<Preparation of Dicing Tape-Integrated Film for Semiconductor Back Surface>

Using a hand roller, the film B for flip chip type semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 10 μm) to prepare a dicing tape-integrated film B for semiconductor back surface.

Comparative Example 1

<Preparation of Film for Flip Chip Type Semiconductor Back Surface>

40 parts of a phenoxy resin (trade name "EP4250" manufactured by JER Co., Ltd.), 129 parts of a phenolic resin (trade name "MEH-8000" manufactured by Meiwa Chemical Co., Ltd.), 426 parts of a spherical silica (trade name "SO-25R" manufactured by Admatechs Co., Ltd.), 14 parts of a dye (trade name "OIL BLACK BS" manufactured by Orient Chemical Industries Co., Ltd.), and 1 part of a curing catalyst (trade name "2PHZ-PW" manufactured by Shikoku Chemical Co., Ltd.) based on 100 parts of an epoxy resin (trade name "HP4032D" manufactured by DIC Co., Ltd.) were dissolved in methyl ethyl ketone to prepare a solution of a resin composition having a solid concentration of 23.6% by weight (this may be referred to as "resin composition solution C").

The resin composition solution C was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film C for flip chip type semiconductor back surface having a thickness (average thickness) of 80

<Preparation of Dicing Tape-Integrated Film for Semiconductor Back Surface>

Using a hand roller, the film C for flip chip type semiconductor back surface was attached to the pressure-sensitive adhesive layer of a dicing tape (trade name "V-8-T" manufactured by Nitto Denko Co., Ltd.; average thickness of the base material, 65 μm; average thickness of the pressure-sensitive adhesive layer, 10 μm) to prepare a dicing tape-integrated film C for semiconductor back surface.

(Tensile Storage Elastic Modulus Before and after Thermal Curing)

Using a cutter knife, the dicing tape-integrated films A to C for semiconductor back surface prepared in Examples and Comparative Example were cut into strip specimens each having a length of 30 mm and a width of 2 mm. Using a tensile tester (TA Instrument's RSAIII), the specimen was heated from −50° C. up to 250° C. at a heating rate of 3° C./min, and the tensile storage elastic modulus thereof at room temperature, 25° C. was measured.

In addition, the dicing tape-integrated films A to C for semiconductor back surface prepared in Examples and Comparative Example were cut into strip specimens in the same manner as above, and the specimen was thermally cured by heating at 165° C. for 2 hours. The specimen after thermal curing was analyzed under the same condition as above, and the tensile storage elastic modulus thereof at room temperature, 25° C. was measured.

(Degree of Warping of Semiconductor Package)

The degree of warping of a semiconductor package was measured to thereby determine as to whether or not the semiconductor chip therein was warped.

Concretely, first, the separator was peeled from the dicing tape-integrated film for semiconductor back surface, and then a semiconductor wafer (silicon mirror wafer, having a diameter of 8 inches and a thickness of 100 μm) was attached under pressure at 70° C. to the film for semiconductor back surface. Further, the semiconductor wafer was diced. The dicing is for full cutting to give chips each having a size of 10 mm square. The attaching conditions and the dicing conditions were as follows.

[Attaching Conditions]
Attaching apparatus: trade name "MA-3000III" manufactured by Nitto Seiki Co., Ltd.
Attaching speed: 10 mm/min
Attaching pressure: 0.15 MPa
Stage temperature at the time of attaching: 70° C.

[Dicing Conditions]
Dicing apparatus: trade name "DFD-6361" manufactured by DISCO Corporation
Dicing ring: "2-8-1" (manufactured by DISCO Corporation)
Dicing speed: 30 mm/sec
Dicing blade:
Z1; "2O3O-SE 27HCDD" manufactured by DISCO Corporation
Z2; "2O3O-SE 27HCBB" manufactured by DISCO Corporation
Dicing blade rotation speed:
Z1; 40,000 r/min
Z2; 45,000 r/min
Cutting method: step cutting
Wafer chip size: 10.0 mm square Next, the semiconductor chips obtained by dicing were picked up from the pressure-sensitive adhesive layer together with the film for flip chip type semiconductor back surface by pushing up the chips from the dicing tape side of the dicing tape-integrated film for semiconductor back surface with needles. The picking-up conditions were as follows.

[Picking-Up Conditions]
Picking-up apparatus: trade name "SPA-300" manufactured by Shinkawa Co., Ltd.
Number of picking-up needles: 9 needles
Pushing-up speed of needle: 20 mm/s
Pushing-up distance of needle: 500 μm
Picking-up time: 1 second
Dicing tape-expanding amount: 3 mm Subsequently, the semiconductor chip was flip chip-bonded on a BT substrate [substrate using Mitsubishi Gas Chemical's BT resin (bismaleimidetriazine-based resin)]. On this occasion, the circuit face of the semiconductor chip was opposed to the BT substrate, a bump formed on the circuit face of the semiconductor chip was brought into contact with the electroconductive material (solder) for conjunction attached to the connecting pad of the BT substrate, and the electroconductive material was melted under pressure by heating up to a temperature to 260° C. and then cooled to room temperature, thereby performing the flip chip bonding. Further, an underfill material as an encapsulating resin was injected into the gaps between the semiconductor chip and the circuit board. The thickness of the underfill material (encapsulating material) was 20 μm. Subsequently, this was heated at 165° C. for 2 hours, and then the degree of warping of the semiconductor package was measured.

The degree of warping was measured as follows: First, the semiconductor package was put on a flat plate in such a manner that the BT substrate thereof could face downward, and the height of the BT substrate separating from the flat plate, or that is, the degree of warping (μm) of the package was measured. For the measurement, used was a contact-type surface roughness meter (Veeco's DEKTAK8) at a measuring speed of 1.5 mm/sec and under a load of 1 g. As a result of the measurement, the samples of which the degree of warping was 200 μm or more were regarded as good (O) and those of which the degree of warping was less than 200 μm were regarded as bad (x). The results are shown in the following Table 1.

TABLE 1

| | Added Amount of Spherical Silica (% by weight)* | Tensile Storage Elastic Modulus before thermal curing (GPa) | Tensile Storage Elastic Modulus after thermal curing (GPa) | Degree of Warping of Semiconductor Package |
|---|---|---|---|---|
| Example 1 | 70 | 3 | 14 | ○ |
| Example 2 | 80 | 3 | 21 | ○ |
| Comparative Example 1 | 60 | 3 | 9 | x |

*The added amount of spherical silica (% by weight) is the percentage thereof relative to the resin composition to form the film for flip chip type semiconductor back surface.

(Results)

As known from Table 1, it is confirmed that, when the tensile storage elastic modulus after thermal curing is within a range of from 4 times to 20 times the tensile storage elastic modulus before thermal curing, as in Examples 1 and 2, then the degree of warping of the semiconductor chip with the film for semiconductor back surface stuck on the back surface thereof is at least 200 μm in every case, and therefore, the whole of the semiconductor package is thereby prevented from being warped. On the other hand, it is confirmed that, when the tensile storage elastic modulus after thermal curing is 3 times the tensile storage elastic modulus before thermal curing, as in Comparative Example 1, then the degree of warping of the semiconductor chip with the film for semiconductor back surface stuck on the back surface thereof is less than 200 μm, and as a result, the whole of the semiconductor package is hardly prevented from being warped.

While the present invention has been described in detail and with reference to specific embodiments thereof, it will be apparent to one skilled in the art that various changes and modifications can be made therein without departing from the scope thereof.

This application is based on Japanese patent application No. 2010-169551 filed Jul. 28, 2010, the entire contents thereof being hereby incorporated by reference.

What is claimed is:

1. A film for flip chip type semiconductor back surface to be formed on the back surface of a semiconductor element flip chip-connected to an adherend,
the film for flip chip type semiconductor back surface having a tensile storage elastic modulus at 25° C. after thermal curing within a range of from 10 GPa to 30 GPa,
wherein the tensile storage elastic modulus at 25° C. after thermal curing of the film for flip chip type semiconductor back surface falls within a range of from 4 times to 20 times the tensile storage elastic modulus at 25° C. before thermal curing thereof.

2. The film for flip chip type semiconductor back surface according to claim 1, wherein the tensile storage elastic modulus at 25° C. before thermal curing thereof is from 0.5 GPa to 7 GPa.

3. The film for flip chip type semiconductor back surface according to claim 1, which is formed of a resin composition comprising a filler in an amount of from 65% by weight to 95% by weight of the resin composition.

4. A dicing tape-integrated film for semiconductor back surface, which comprises a dicing tape, and the film for flip chip type semiconductor back surface according to claim 1 laminated on the dicing tape,
wherein the dicing tape comprises a base material and a pressure-sensitive adhesive layer laminated on the base material, and the film for flip chip type semiconductor back surface is laminated on the pressure-sensitive adhesive layer.

5. A method for producing a semiconductor device wherein the dicing tape-integrated film for semiconductor back surface according to claim 4 is used, the method comprising:
attaching a semiconductor wafer onto the film for flip chip type semiconductor back surface in the dicing tape-integrated film for semiconductor back surface,
dicing the semiconductor wafer to form a semiconductor element,
peeling the semiconductor element along with the film for flip chip type semiconductor back surface, from the pressure-sensitive adhesive layer of the dicing tape, and
flip chip-connecting the semiconductor element onto an adherend.

6. The method for producing a semiconductor device according to claim 5, wherein said flip chip-connecting includes filling an encapsulating resin into a gap between the semiconductor element flip chip-bonded onto the adherend and the adherend, followed by thermally curing the encapsulating resin.

7. The method for producing a semiconductor device according to claim 5, wherein the semiconductor wafer has a thickness falling within a range of from 20 μm to 300 μm.

8. A flip chip type semiconductor device produced in accordance with said semiconductor device production method according to claim 5.

* * * * *